(12) United States Patent
Akasaka et al.

(10) Patent No.: US 7,622,340 B2
(45) Date of Patent: Nov. 24, 2009

(54) METHOD FOR MANUFACTURING SEMICONDUCTOR DEVICE

(75) Inventors: Yasushi Akasaka, Nirasaki (JP); Genji Nakamura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 341 days.

(21) Appl. No.: 11/523,566

(22) Filed: Sep. 20, 2006

(65) Prior Publication Data

US 2007/0066077 A1 Mar. 22, 2007

(30) Foreign Application Priority Data

Sep. 22, 2005 (JP) .............................. 2005-275594

(51) Int. Cl.
*C12N 9/22* (2006.01)
(52) U.S. Cl. ...................... 438/199; 438/714; 438/717
(58) Field of Classification Search ................ 438/153, 438/154, 199, 207, 714, 717, 723, 724, 756, 438/757; 257/E21.177, E21.19, E21.191, 257/E21.192, E21.227, E21.232, E21.249
See application file for complete search history.

(56) References Cited

U.S. PATENT DOCUMENTS

2003/0153150 A1* 8/2003 Dong et al. ................. 438/257
2006/0261037 A1* 11/2006 Ohmi et al. .................... 216/67
2007/0004931 A1* 1/2007 Xiao et al. .................... 556/413
2007/0048919 A1* 3/2007 Adetutu et al. .............. 438/199
2007/0069298 A1* 3/2007 Lu et al. ...................... 257/357
2007/0111538 A1* 5/2007 Iyer et al. .................... 438/778
2007/0129273 A1* 6/2007 Clark et al. .................. 510/175

OTHER PUBLICATIONS

S. B. Samavedam, et al., "Dual-Metal Gate CMOS with HfO$_2$ Gate Dielectric," IEDM Tech. Digest, 2002, 4 pages.

* cited by examiner

*Primary Examiner*—Minh-Loan T Tran
*Assistant Examiner*—Vongsavanh Sengdara
(74) *Attorney, Agent, or Firm*—Oblon, Spivak, McClelland, Maier & Neustadt, L.L.P.

(57) ABSTRACT

A method for manufacturing a semiconductor device includes doping a surface of a silicon-containing dielectric film with nitrogen to change an etching rate of the silicon-containing dielectric film relative to a predetermined solution such that the etching rate is lower at a surface portion doped with nitrogen than at a portion therebelow. The method subsequently includes patterning the silicon-containing dielectric film by a first etching process to form an etching mask, subsequently to the first etching process, removing etching residues of the silicon-containing dielectric film by a second etching process including wet etching using the predetermined solution, and subsequently to the second etching process, patterning an etching target film by a third etching process using the etching mask.

16 Claims, 10 Drawing Sheets

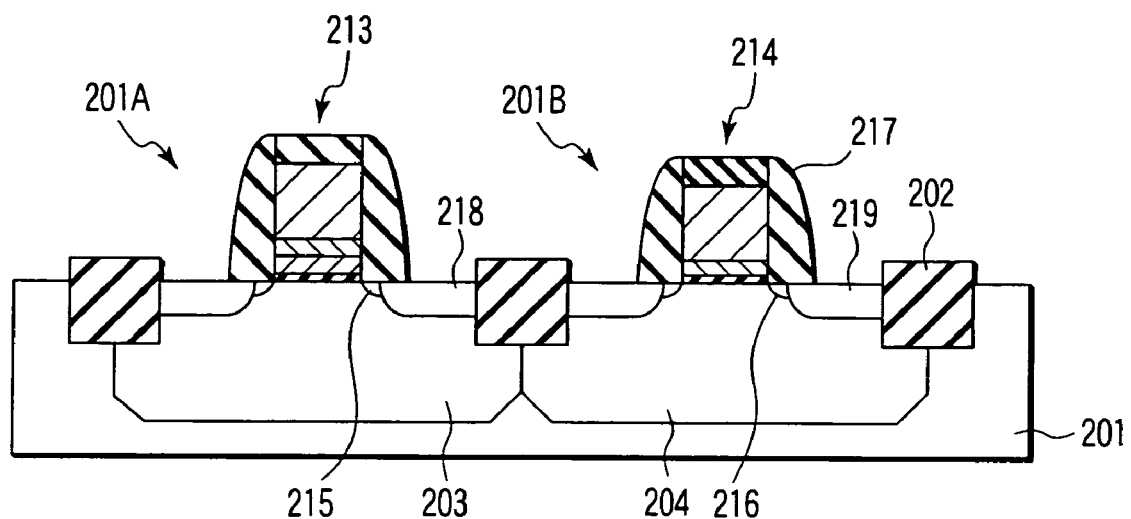
F I G. 12
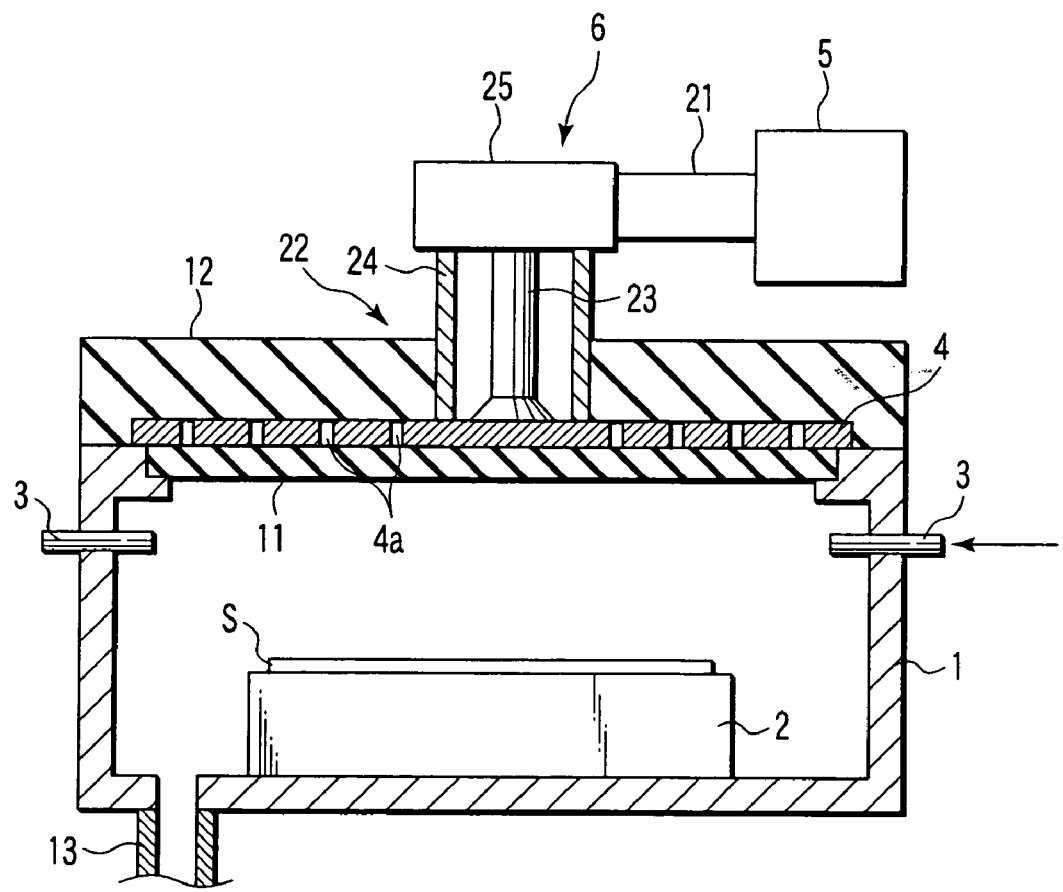
F I G. 13

METHOD FOR MANUFACTURING SEMICONDUCTOR DEVICE

CROSS-REFERENCE TO RELATED APPLICATIONS

This application is based upon and claims the benefit of priority from prior Japanese Patent Application No. 2005-275594, filed Sep. 22, 2005, the entire contents of which are incorporated herein by reference.

BACKGROUND OF THE INVENTION

1. Field of the Invention

The present invention relates to a method for manufacturing a semiconductor device, particularly an FET (Field Effect Transistor) of the MIS (Metal Insulator Semiconductor) type, and to a method for forming a silicon-containing dielectric (insulating) film, utilized in, e.g., a semiconductor processing system. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

In recent years, owing to the demands of increased miniaturization, CMOS (Complementary Metal Oxide Semiconductor) transistors comprising MISFETs having a dual metal gate structure have attracted attentions. For example, Samavedam et al., IEDM Tech. Digest, p. 443, 2002 (Non-Patent Document 1) discloses a process for manufacturing a CMOS transistor, as shown in FIGS. 27 to 31.

At first, as shown in FIG. 27, an n-type well 102 and a p-type well 103 are respectively formed in the surface of first and second areas 101A and 101B of a silicon substrate 101. Then, as shown in FIG. 28, an $HfO_2$ film 104 to be used as a gate dielectric (insulating) film, a TiN film 105 to be used as a first gate electrode material, and a silicon oxide film 106 to be used as an etching mask material are deposited in this order on the substrate 101. Then, a photo-resist mask 107 is formed on the silicon oxide film 106 by utilizing the mask for the p-type well. Then, as shown in FIG. 29, the part of the silicon oxide film 106 within the second area 101B is removed to form a hard mask 106a made from the silicon oxide film and covering the first area 101A. Then, as shown in FIG. 30, the exposed portion of the TiN film is removed by wet etching using the hard mask 106a. Then, after the hard mask 106a is removed by HF (hydrogen fluoride), as shown in FIG. 31, a TaSiN film 108 to be used as a second gate electrode material and a poly-crystalline silicon film 109 are deposited in this order all over the substrate. The hard mask may be formed of a silicon nitride film.

Thereafter, although not disclosed in Non-Patent Document 1, ordinary steps are conducted to perform gate electrode patterning, and formation of extensions (which are to be used as lightly doped regions in source/drain layers), gate sidewalls, source/drain layers, and interconnections, thereby completing a complementary transistor structure of the MIS type.

BRIEF SUMMARY OF THE INVENTION

An object of the present invention is to provide a method for manufacturing a semiconductor device, which can solve a problem due to etching residues of a silicon-containing dielectric film, and a method for forming a silicon-containing dielectric film with a surface having a low etching rate.

According to a first aspect of the present invention, there is provided a method for manufacturing a semiconductor device, the method comprising:

forming an etching target film on an underlayer;

forming a silicon-containing dielectric film on the etching target film;

doping a surface of the silicon-containing dielectric film with nitrogen to change an etching rate of the silicon-containing dielectric film relative to a predetermined solution such that the etching rate is lower at a surface portion doped with nitrogen than at a portion therebelow;

patterning the silicon-containing dielectric film by a first etching process to form an etching mask;

subsequently to the first etching process, removing etching residues of the silicon-containing dielectric film by a second etching process comprising wet etching using the predetermined solution;

subsequently to the second etching process, patterning the etching target film by a third etching process using the etching mask; and subsequently to the third etching process, removing the etching mask.

According to a second aspect of the present invention, there is provided a method for manufacturing a semiconductor device, the method comprising:

forming a well of first conductivity type and a well of a second conductivity type in surfaces of a first area and a second area of a semiconductor substrate, respectively;

depositing a gate dielectric film on the substrate over the first and second areas;

forming a first conductive film on the gate dielectric film over the first and second areas;

depositing a silicon-containing dielectric film on the first conductive film over the first and second areas;

doping a surface of the silicon-containing dielectric film with nitrogen to change an etching rate of the silicon-containing dielectric film relative to a predetermined solution such that the etching rate is lower at a surface portion doped with nitrogen than at a portion therebelow;

patterning the silicon-containing dielectric film by a first etching process to form an etching mask covering a predetermined part of the first area;

subsequently to the first etching process, removing etching residues of the silicon-containing dielectric film by a second etching process comprising wet etching using the predetermined solution;

subsequently to the second etching process, patterning the first conductive film by a third etching process using the etching mask, such that a predetermined portion of the first conductive film is left within the first area, and a predetermined portion of the gate dielectric film is exposed within the second area;

subsequently to the third etching process, removing the etching mask;

subsequently to removing the etching mask, forming a second conductive film over the predetermined portion of the first conductive film within the first area and the predetermined portion of the gate dielectric film within the second area; and patterning the first and second conductive films together, to form a first gate electrode including the first and second conductive films within the first area, and a second gate electrode including the second conductive film within the second area.

According to a third aspect of the present invention, there is provided a method for forming a silicon-containing dielectric film, the method comprising:

depositing a silicon-containing dielectric film; and doping a surface of the silicon-containing dielectric film with nitrogen to change an etching rate of the silicon-containing dielectric film relative to a predetermined solution such that the etching rate is lower at a surface portion doped with nitrogen than at a portion therebelow.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 1, 2, 3, 4, 5, 6, 7, 8, 9, 10, 11, and 12 are sectional views showing sequentially ordered steps in a method for manufacturing a semiconductor device according to a first embodiment of the present invention;

FIG. 13 is a sectional view showing an example of a plasma processing apparatus for performing a nitriding process on a surface of a silicon-containing dielectric film;

DETAILED DESCRIPTION OF THE INVENTION

In the process of developing the present invention, the inventors studied problems caused in conventional methods for manufacturing a semiconductor device, as those disclosed in Non-Patent Document 1 and so forth. As a result, the inventors have arrived at the findings given below.

Figure 29:
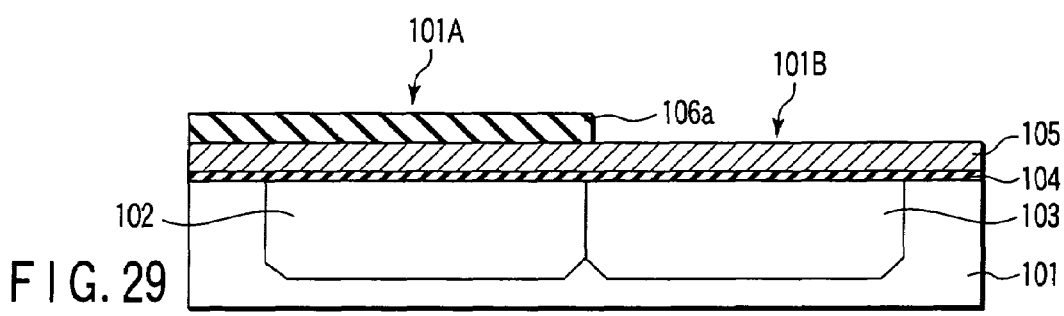
Figure 30:
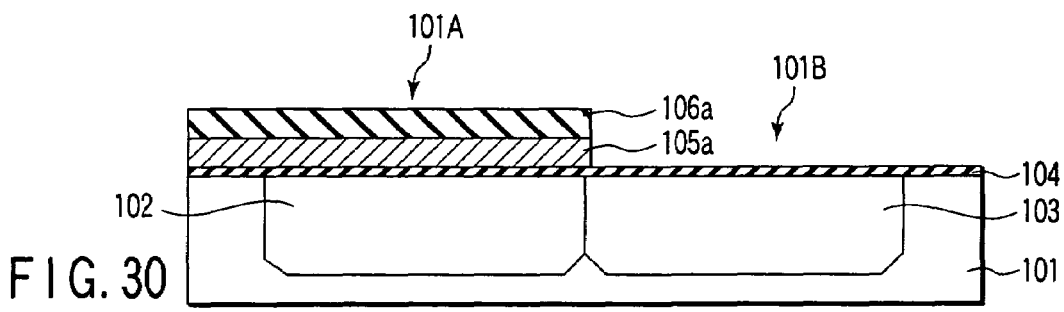
Figure 31:
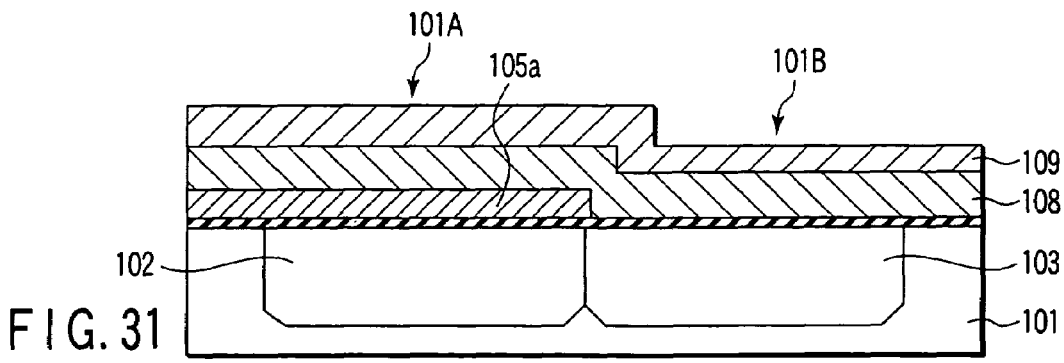

Although not shown in Non-Patent Document 1, the Si substrate 101 actually includes thereon steps and/or recesses formed due to device isolation or the like. In this respect, as shown in FIG. 29, according to the process disclosed in this document, the part of the silicon oxide film 106 within the second area 101B is removed to form a hard mask 106*a* made from the silicon oxide film and covering the first area 101A. At this time, residues of the silicon oxide film are probably generated and left in steps and/or recesses formed due to device isolation or the like. Since such residues may cause structural defects, it is necessary to remove them.

As a countermeasure for this, it is possible to adopt a technique of performing sufficient over-etching, thereby removing the residues, when the hard mask 106*a* is formed. However, in this case, a problem may arise such that the gate electrode material film 105 within the second area 101B is penetrated, and further the gate dielectric film 104 is damaged. As another countermeasure, it is possible to adopt a technique of performing wet etching to remove the residues, after the hard mask 106*a* is formed. However, in this case, the hard mask 106*a* may be undesirably etched. In consideration of this latter problem, a silicon oxide film having a higher wet-etching resistance as a whole may be used as a material of the hard mask 106*a*. However, in this case, the hard mask 106*a* requires a complex formation process, and it further becomes difficult to remove thereafter.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

FIRST EMBODIMENT

Figure 1:
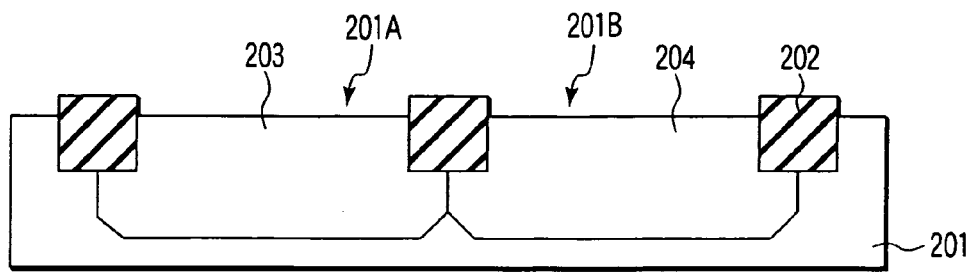

FIGS. 1 to 12 are sectional views showing sequentially ordered steps in a method for manufacturing a semiconductor device according to a first embodiment of the present invention. At first, as shown in FIG. 1, an n-type well 203 and a p-type well 204 are respectively formed in the surface of first and second areas 201A and 201B of a semiconductor substrate 201 consisting mainly of silicon. Further, a device isolation area 202 is formed in the surface of the substrate 201 to surround the first and second areas 201A and 201B. The first and second areas 201A and 201B correspond to areas for forming a p-type MISFET and an n-type MISFET, respectively.

Figure 2:
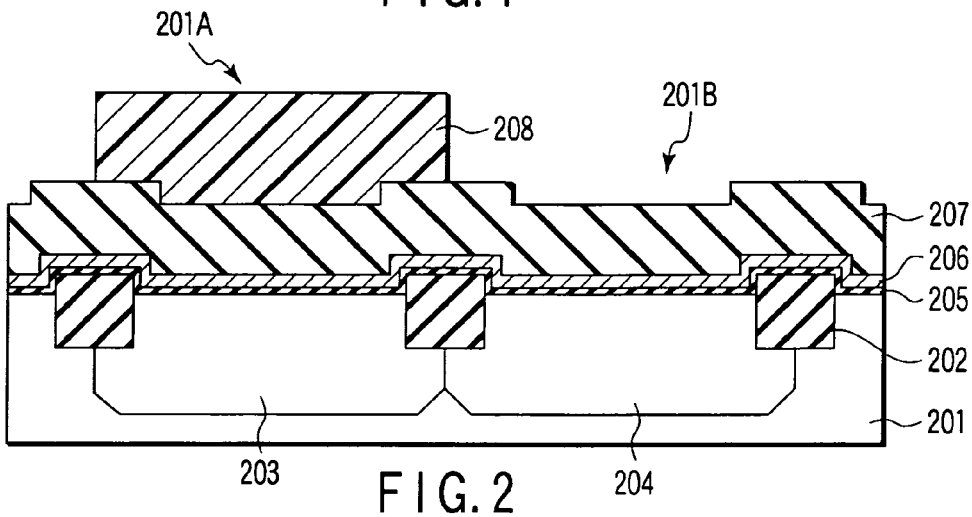

Then, as shown in FIG. 2, a gate dielectric (insulating) film 205 is deposited all over the substrate. The gate dielectric film 205 may be preferably made of a film of $HfO_2$, $HfSi_xO_y$, $HfAl_xO_y$, or $SiO_2$ doped with nitrogen. The film thickness of the gate dielectric film 205 is preferably set to agree with an effective film thickness (EOT) of 1.5 nm or less, to manufacture a MISFET having a gate length of 100 nm or less. EOT is expressed by a value converted into the thickness of a silicon oxide film having an equivalent gate capacity.

Then, a TiN conductive film 206 to define the bottom portion of the gate electrode of the p-type MISFET is formed on the gate dielectric film 205 all over the substrate. The conductive film 206 is disposed to control the work function of the gate electrode of the p-type MISFET. Accordingly, the type of the material of the conductive film 206 should be determined in consideration of its work function.

Specifically, in order to decrease the threshold voltage of the p-type MISFET, the material is preferably selected to have a work function close to that of $p^+$-poly-crystalline silicon, such as a work function of 4.8 to 5.3 eV. For example, in the case of a pure metal, a Group-VIII element, such as Ni, Pd, Pt, Co, Rh, or Ru, is preferably used. Alternatively, a metal silicide, a metal nitride, or another compound may be used, as long as it has a metallic band structure with a work function close to that of $p^+$-poly-crystalline silicon. The film thickness of the conductive film 206 is preferably set to be about 5 nm, but it may be set at a very small value of about 1 to 2 nm. In this embodiment, a titanium nitride (TiN) film having a work function of about 4.8 eV is used as the conductive film 206.

Then, a silicon-containing dielectric (insulating) film is deposited on the conductive film 206 all over the substrate. Further, the surface of the silicon-containing dielectric film is doped with nitrogen to form a reinforced silicon-containing dielectric film 207. The step of depositing the silicon-containing dielectric film and the step of doping with nitrogen will be described later in detail. Then, a photo-resist mask 208 is formed by a photolithography method, so that it covers at least an area where the gate electrode of the p-type MISFET is to be formed.

Figure 3:
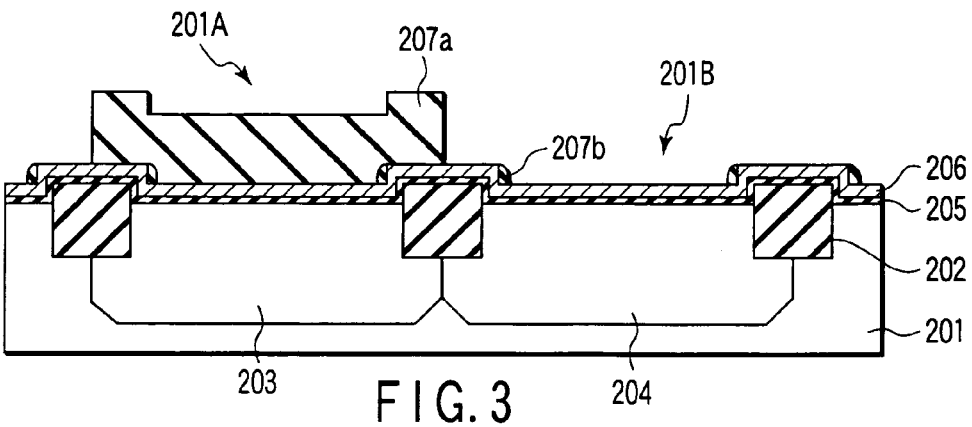

Then, as shown in FIG. 3, the reinforced silicon-containing dielectric film 207 is etched by anisotropic etching, such as RIE, using the photo-resist mask 208. With this step, an etching mask 207a is formed to cover at least the area where the gate electrode of the p-type MISFET is to be formed. Then, the photo-resist mask 208 is removed. It should be noted that, after the reinforced silicon-containing dielectric film 207 is etched, residues 207b of the silicon-containing dielectric film 207 remain on step portions around the device isolation area 202 and so forth.

Figure 4:
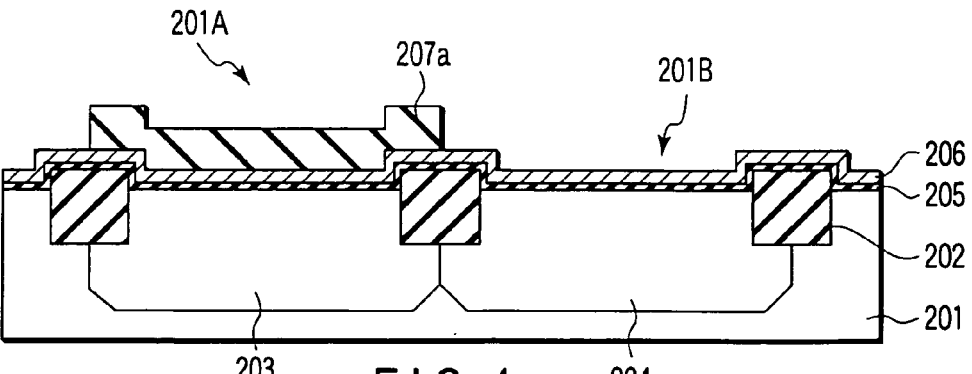

Then, as shown in FIG. 4, the residues 207b of the silicon-containing dielectric film 207 are removed by wet etching using a solution containing HF (hydrogen fluoride). In this respect, the residues 207b do not correspond to the exposed surface layer of the reinforced silicon-containing dielectric film 207, but to the portion thereof undoped with nitrogen. Accordingly, the residues 207b render a higher wet-etching rate, while the surface layer of the etching mask 207a renders a lower etching rate, thanks to the nitriding process. Thus, the residues 207b can be removed while the etching mask 207a is less etched.

Figure 5:
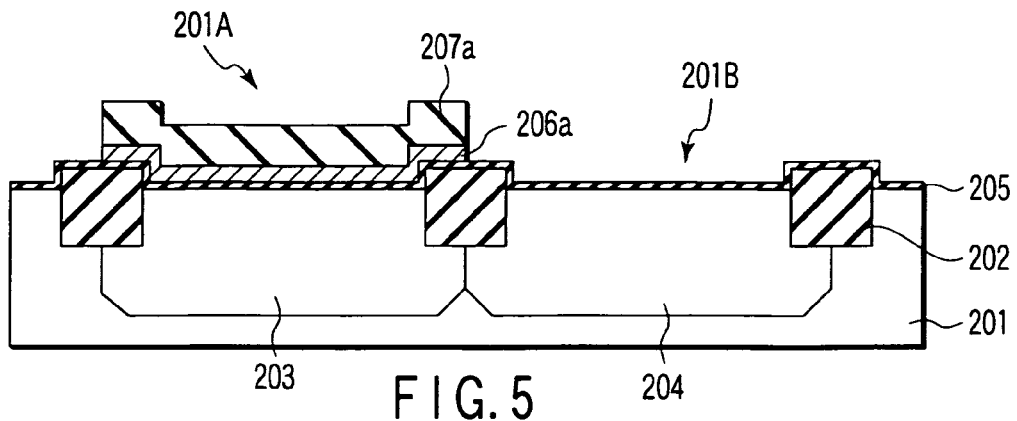

Then, as shown in FIG. 5, wet etching using a solution of, e.g., $H_2O_2$ or a mixture of $H_2SO_4$ and $H_2O_2$ is performed thorough the etching mask 207a used as a mask. Consequently, a pre-patterned conductive film 206a is formed by patterning of the conductive film 206. The pre-patterned conductive film 206a is shaped to cover at least that part of the gate dielectric film 205 where the gate electrode of the p-type MISFET is to be formed in the first area 201A. On the other hand, this patterning exposes that part of the gate dielectric film 205 where the gate electrode of the n-type MISFET is to be formed in the second area 201B.

Figure 6:
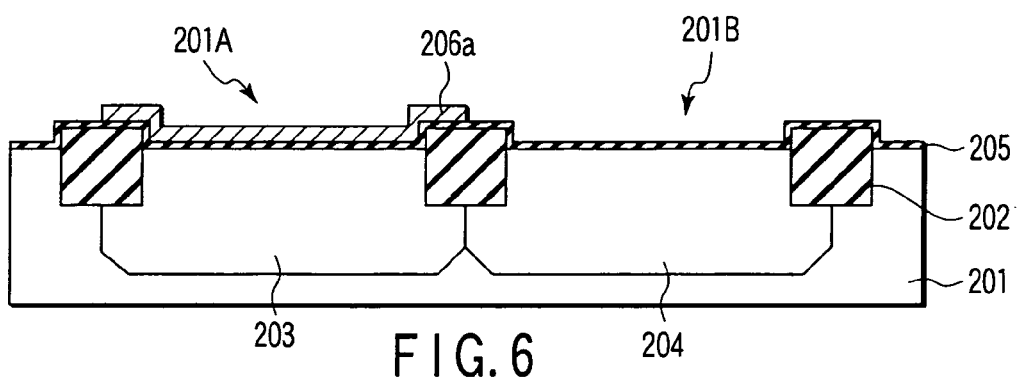

Then, as shown in FIG. 6, the etching mask 207a is removed, using a solution containing HF and so forth. At this time, the nitrided surface layer of the etching mask has already been removed by etching for removing the residues 207b described above, and thus the remaining portion renders a higher etching rate. This makes it possible to shorten the time during which the gate dielectric film 205 is exposed to the wet etching. Incidentally, of the materials usable for the gate dielectric film 205, $HfO_2$ and $HfAl_xO_y$ are known to be hardly etched by wet etching using HF. $HfSi_xO_y$ is known to be etched by HF, but the wet-etching rate thereof can be set very low by optimizing a heat process after deposition.

Figure 7:
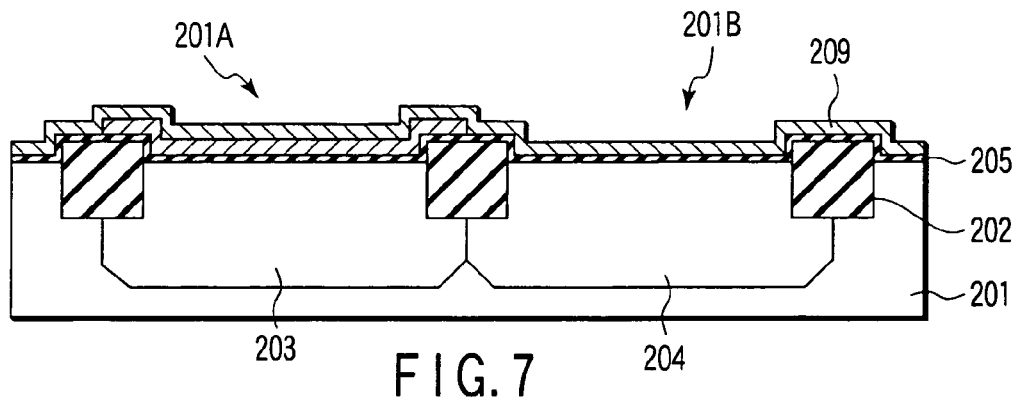

Then, as shown in FIG. 7, a conductive film 209 to define the bottom portion of the gate electrode of the n-type MISFET is formed all over the substrate. The conductive film 209 is disposed to control the work function of the gate electrode of the n-type MISFET. Accordingly, the type of the material of the conductive film 209 should also be determined in consideration of its work function.

Specifically, in order to decrease the threshold voltage of the n-type MISFET, the material is preferably selected to have a work function close to that of $n^+$-poly-crystalline silicon, such as a work function of 3.9 to 4.2 eV. For example, in the case of a pure metal, a Group-IVa element, such as Ti, Zr, or Hf, a Group-Va element, such as V, Nb, or Ta, or a Group-VIa element, such as Cr, Mo, or W, is preferably used. Alternatively, a metal silicide, a metal nitride, or another compound may be used, as long as it has a metallic band structure with a work function close to that of $n^+$-poly-crystalline silicon. The film thickness of the conductive film 209 may be set at a very small value of about 1 to 2 nm.

Figure 8:
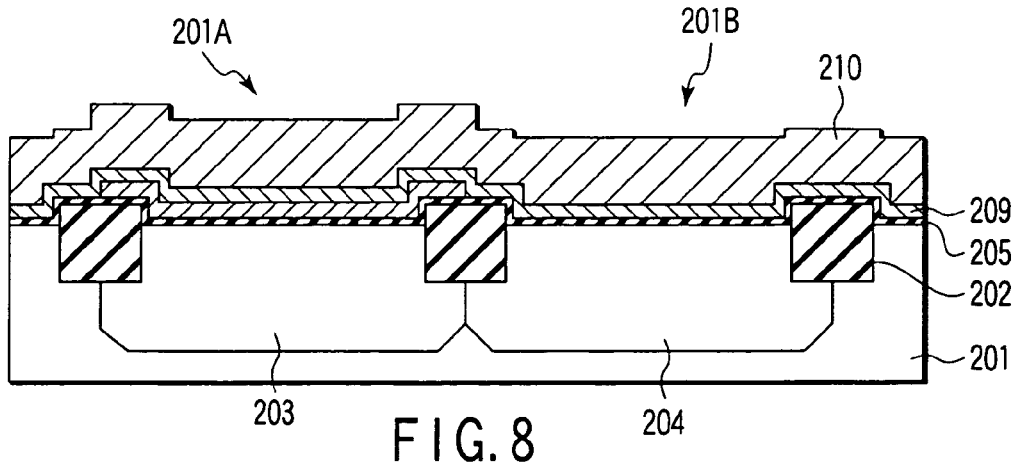

Then, as shown in FIG. 8, a conductive film 210 to decrease the resistance of the gate electrode is deposited all over the substrate. The film thickness of the conductive film 210 is preferably set to provide a sheet resistance of about 5Ω/□ or less, such as about 40 to 50 nm in the case of W being used. In this embodiment, the conductive film 209 and conductive film 210 are made of different conductive materials. However, where the material selected for the conductive film 209 has a resistivity almost equal to or less than that required for the conductive film 210 and suitable for the subsequent steps, the conductive film 209 and conductive film 210 are made of one integral film. The conductive film 206 for the gate electrode of the p-type MISFET and the conductive film 209 for the gate electrode of the n-type MISFET may be deposited in an order reverse to that of the embodiment, in consideration of their workability, reactivity, and so forth.

Figure 9:
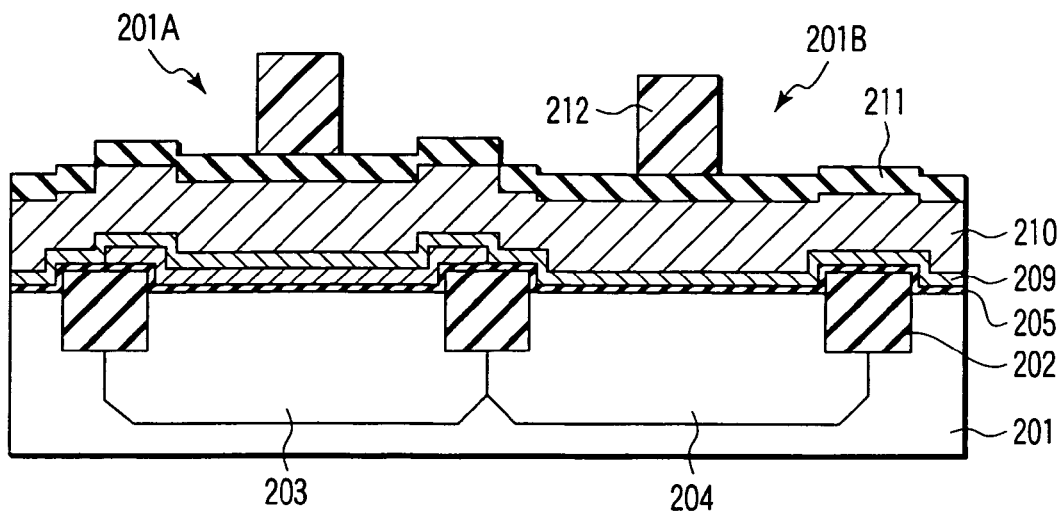

Then, as shown in FIG. 9, a cap film 211 is deposited all over the substrate. The cap film 211 is preferably formed of a film that is not degenerated by ion implantation. The cap film 211 preferably has a barrier property against metal oxidation in an oxidizing atmosphere. The material of the cap film 211 is required not to react with the conductive film 210 in a heating step to electrically activate impurities. Further, the material of the cap film 211 is preferably hardly etched in a cleaning step. In light of these requirements, the cap film 211 is preferably formed of a silicon nitride film. Alternatively, the cap film 211 may be formed of a silicon oxide film, and, in this case, a cleaning step using an HF-containing solution is arranged to set the etching amount of the silicon oxide film to be smaller. Alternatively, the cap film 211 may have a multi-layer structure formed of a silicon oxide film and a silicon nitride film. The cap film 211 may be made of another material, as long as it satisfies the requirements described above. The cap film 211 can be used not only for protection of the conductive film 210, but also as a hard mask for processing gate electrodes.

Figure 10:
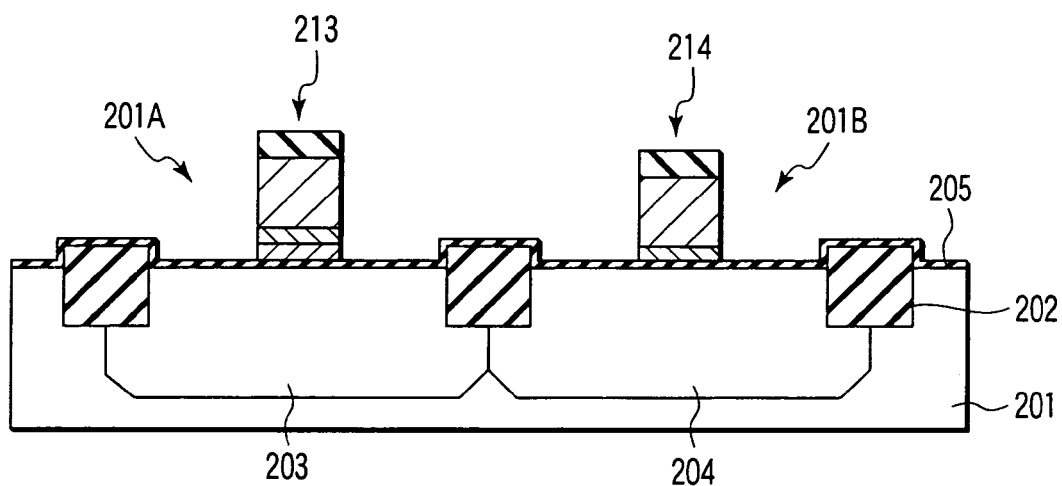

Then, a photo-resist pattern 212 is formed on the cap film 211 by a photolithography method. Then, patterning for gate processing is performed by anisotropic etching, such as RIE, using the photo-resist pattern 212 as a mask. With this patterning, as shown in FIG. 10, the gate electrode 213 of the p-type MISFET and the gate electrode 214 of the n-type MISFET are respectively formed in the first and second areas 201A and 201B. At this time, it is important to set the etching to have high selectivity for the gate electrodes relative to the gate dielectric film, so that damage to the substrate can be reduced to a minimum.

Figure 11:
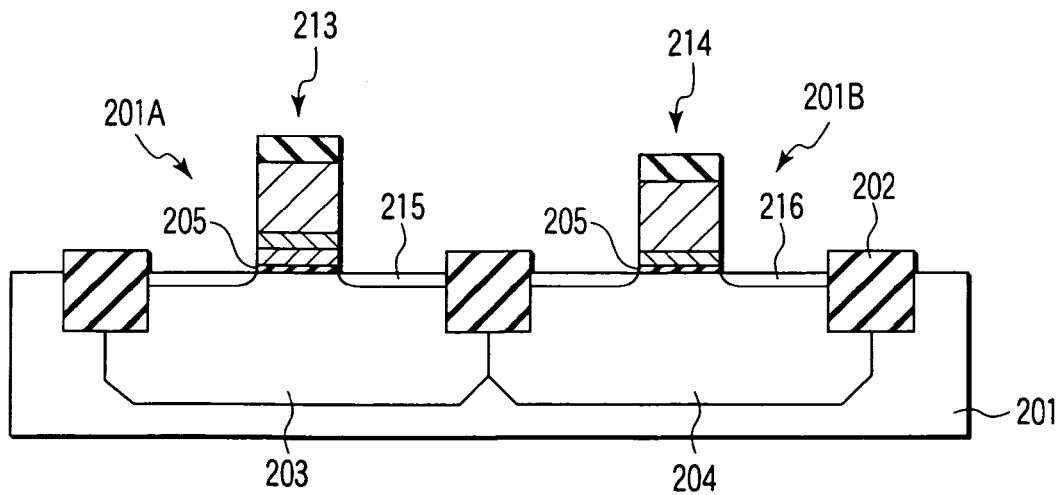

Then, as shown in FIG. 11, the gate dielectric film 205 is etched to remove the unnecessary portion thereof exposed on the substrate surface around the gate electrodes. Then, extensions 215 respectively used for the p-type MISFET and n-type MISFET are formed. The extensions are to be used as lightly doped regions in the source/drain layers of the MISFETs. The extension 215 for the p-type MISFET is formed by ion implantation using a photo-resist mask covering the second area 201B. On the other hand, the extension 216 for the n-type MISFET is formed by ion implantation using a photo-resist mask covering the first area 201A. At this time, an offset spacer (not shown) of an insulating film may be suitably formed to protect the side surfaces of the gate electrodes and to adjust the overlapping degree between the gates and extensions.

Then, as shown in FIG. 12, gate sidewalls 217 are formed from an insulating film. The gate sidewalls are preferably made of a silicon nitride film, but may be made of a multi-layer structure formed of a silicon oxide film and a silicon nitride film. Then, the source/drain layers 218 of the p-type MISFET and the source/drain layers 219 of the n-type MISFET are formed by ion implantation using the gate electrodes and sidewalls as masks. Further, annealing is performed at 1,000° C. for 1 second or at 1,050° C. for about 1 second to electrically activate ion-implanted impurities.

Thereafter, inter-level insulating films, interconnections, and so forth are formed by conventional techniques to complete the MISFETs. Further, silicide may be formed on the source/drain layers by a SALICIDE method, as needed.

In the method according to the first embodiment described above, the etching mask 207a used for etching the conductive film 206 is formed from the reinforced silicon-containing dielectric film 207 having a surface doped with nitrogen. Accordingly, when wet etching using an HF-containing solution is performed to remove the residues 207b generated by etching for forming the etching mask 207a, the etching rate of the etching mask 207a can be set low. Consequently, the portion covered with the etching mask 207a is prevented from being damaged, and there is no need to use excessive etching that may penetrate the conductive film 206 and damage the gate dielectric film 205.

The silicon-containing dielectric film for forming the etching mask 207a may be a film selected from the group consisting of a silicon nitride film, a silicon oxynitride film, and a silicon oxide film. Such a film may be formed by CVD using a first process gas containing a silane family gas, and a second process gas containing a gas selected from the group consisting of a nitriding gas, an oxynitriding gas, and an oxidizing gas.

The silane family gas may be one or more gases selected from the group consisting of dichlorosilane (DCS), hexachlorodisilane (HCD), monosilane ($SiH_4$), disilane ($Si_2Cl_6$), hexamethyl-disilazane (HMDS), tetrachlorosilane (TCS), disilylamine (DSA), trisilylamine (TSA), bistertial-butylaminosilane (BTBAS). The nitriding gas may be ammonia ($NH_3$) or nitrogen ($N_2$). The oxynitriding gas may be dinitrogen oxide ($N_2O$) or nitrogen oxide (NO). The oxidizing gas may be oxygen ($O_2$) or ozone ($O_3$).

The reinforced silicon-containing dielectric film 207 is obtained by doping the surface of the silicon-containing dielectric film with nitrogen to nitride only the surface. For example, where a silicon nitride or silicon oxide film is formed while using HCD, the film is etched by an HF-containing solution. However, where the surface of the film is doped with nitrogen, the etching rate of the film relative to the HF solution is decreased. In this respect, the nitrogen dosage into the surface of the silicon-containing dielectric film is preferably set to obtain a nitrogen concentration of 10 to 60 atm % in the surface of the film.

The step of doping with nitrogen may be performed by a plasma nitriding process, nitrogen ion implantation, or heating process in a nitrogen-containing atmosphere, such as ammonia. Of these, the plasma nitriding process is preferably used. The plasma nitriding process makes it possible to introduce nitrogen into a very thin surface region at a high concentration with high controllability. In this case, the film can easily be given a desired wet-etching resistance, and further the film can be easily removed thereafter, as needed, since the portion doped with nitrogen is very thin.

The plasma nitriding process is preferably a plasma process of the RLSA (Radial Line Slot Antenna) microwave plasma type. The plasma process of this type can realize a low temperature process with a low-electron temperature and high-density plasma. Accordingly, a nitrided region with a high nitrogen concentration can be formed as a very thin region of 2 nm or less from the surface of the silicon-containing dielectric film, without imparting plasma damage to the underlayer.

For example, International Publication No. 02/058130 discloses a plasma processing apparatus of the RLSA microwave plasma type. FIG. 13 is a sectional view showing an example of a plasma processing apparatus for performing a nitriding process on a surface of a silicon-containing dielectric film, which is disclosed in this document. Specifically, as shown in FIG. 13, this plasma processing apparatus includes an essentially cylindrical process chamber 1. The process chamber 1 is provided with a susceptor 2 disposed therein to place a semiconductor wafer thereon. The process chamber 1 is connected to a gas supply portion 3 disposed at the sidewall to supply a nitrogen-containing process gas, such as nitrogen gas, into the process chamber 1. The process chamber 1 is further connected to a vacuum-exhaust system (not shown) through an exhaust line 13 disposed at the bottom.

The process chamber 1 has an opening at the top, which is covered with a planar antenna 4 having a number of microwave-transmission holes 4a formed therein. The planar antenna 4 is connected to a microwave generator 5 for generating microwaves, through a microwave-transmission mechanism 6. The planar antenna 4 faces a microwave-transmission plate 11 disposed therebelow and made of a dielectric material. On the other hand, the planar antenna 4 is covered with a shield member 12. The microwave-transmission mechanism 6 includes a waveguide tube 21 extending in a horizontal direction to guide microwaves from the microwave generator 5, and a coaxial waveguide tube 22 extending upward from the planar antenna 4 and formed of an inner conductive body 23 and an outer conductive body 24. The waveguide tube 21 is connected to the coaxial waveguide tube 22 through a mode transducer 25.

The plasma processing apparatus having such a structure is applied to the step of doping the surface of the silicon-containing dielectric film with nitrogen to obtain the reinforced silicon-containing dielectric film 207 (see FIG. 2), as follows. Specifically, microwaves are generated in the microwave generator 5 and are guided to the planar antenna 4 with a predetermined mode through the microwave-transmission mechanism 6. Then, the microwaves are supplied uniformly into the process chamber 1 through the microwave-transmission holes 4a of the planar antenna 4 and the microwave-transmission plate 11. On the other hand, a nitrogen-containing process gas is supplied from the gas supply portion 3 into the process chamber 1. The nitrogen-containing process gas is turned into plasma by the microwaves, and this plasma is used to perform a nitriding process on the surface of the silicon-containing dielectric film disposed on the silicon substrate S.

Experiment

Using the plasma processing apparatus shown in FIG. 13, a plasma nitriding process was performed on the surface of a silicon nitride film, and then the silicon nitride film was examined in terms of its wet-etching characteristic. The silicon nitride film was formed by a CVD method using a first process gas containing HCD and a second process containing ammonia. When the plasma nitriding process was performed on the surface of the silicon nitride film, the apparatus shown in FIG. 13 was set to have conditions including a substrate temperature of 400° C. to dope the surface layer of an $SiO_2$ film with nitrogen by about 15 atm % at a depth of 3 nm from the surface of the film. Then, wet etching was performed on the silicon nitride film having the surface thus subjected to the plasma nitriding process, and the etching rate at this time was measured.

Figure 14:
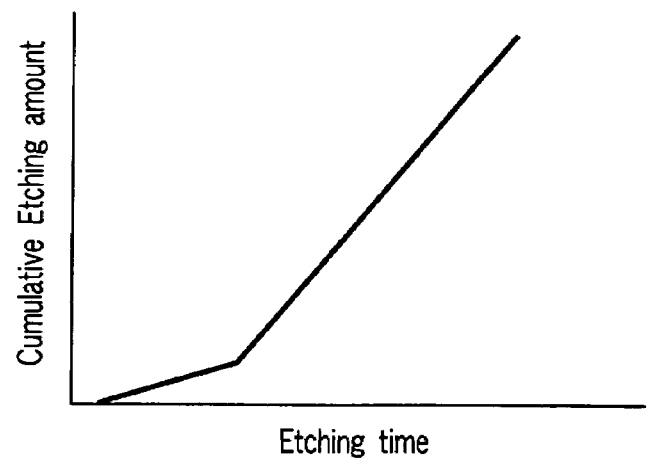
FIG. 14 is a graph showing the wet-etching characteristic of a silicon nitride film having a surface subjected to a plasma nitriding process.

FIG. 14 is a graph showing the wet-etching characteristic of the silicon nitride film having the surface subjected to the plasma nitriding process. In FIG. 14, the horizontal axis denotes the etching time, and the vertical axis denotes the cumulative etching amount. As shown in FIG. 14, it was confirmed that the etching rate of the surface layer doped with nitrogen was about ½ or less of the etching rate of the layer therebelow.

SECOND EMBODIMENT

Figure 15:
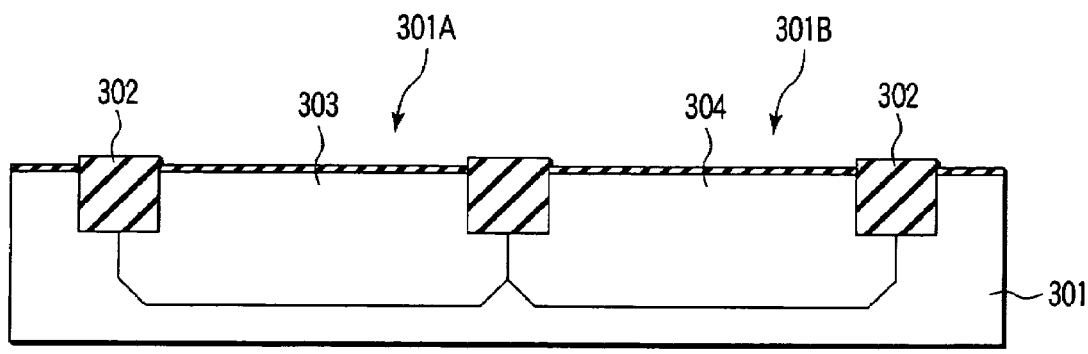
FIGS. 15, 16, 17, 18, 19, 20, 21, 22, 23, 24, 25, and 26 are sectional views showing sequentially ordered steps in a method for manufacturing a semiconductor device according to a second embodiment of the present invention.

FIGS. 15 to 26 are sectional views showing sequentially ordered steps in a method for manufacturing a semiconductor device according to a second embodiment of the present invention. At first, as shown in FIG. 15, an n-type well 303 and a p-type well 304 are respectively formed in the surface of first and second areas 301A and 301B of a semiconductor substrate 301 consisting mainly of silicon. Further, a device isolation area 302 is formed in the surface of the substrate 301 to surround the first and second areas 301A and 301B. The first and second areas 301A and 301B correspond to areas for forming a p-type MISFET and an n-type MISFET, respectively.

Figure 16:
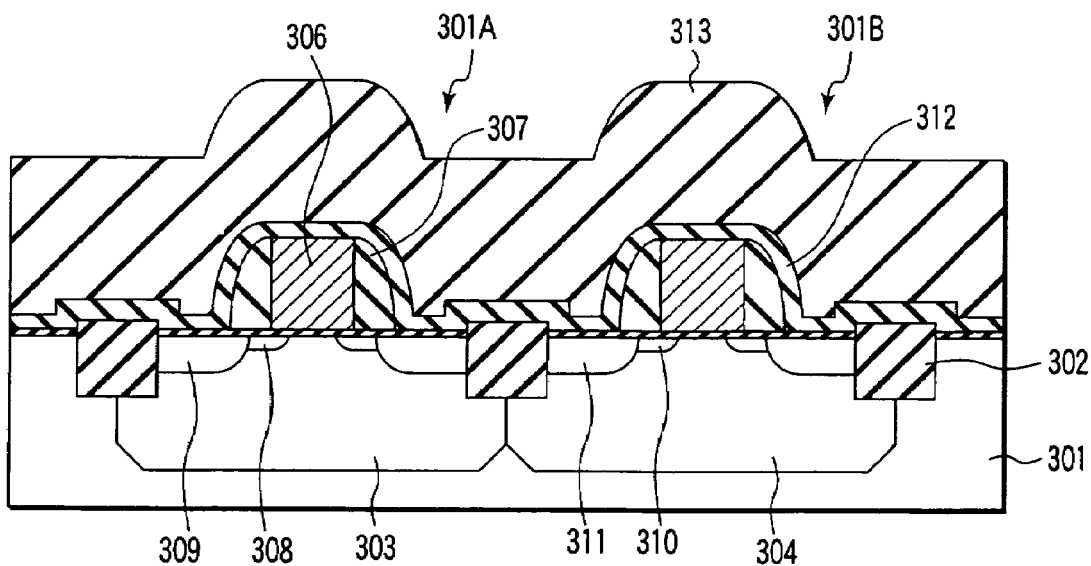

Then, as shown in FIG. 16, a starting structure including a dummy gate electrode made of, e.g., poly-crystalline silicon is formed by conventional techniques for forming transistors. In this starting structure, the source/drain layers 309 and extensions 308 of the p-type MISFET are formed in the n-type well 303 within the first area 301A. Similarly, the source/drain layers 311 and extensions 310 of the n-type MISFET are formed in the p-type well 304 within the second area 301B. Further, a dummy gate electrode 306 made of poly-crystalline silicon is disposed through a dummy gate dielectric (insulating) film 305 formed of a silicon oxide film, at each of predetermined positions on the substrate within the first and second areas 301A and 301B. A gate sidewall 307 formed of an insulating film, such as a silicon nitride film is disposed on the side surface of each dummy gate electrode 306. The dummy gate electrode 306 and gate sidewall 307 are covered with a silicon nitride film 312 serving as an etching stopper. Further, an inter-level insulating film 313 is disposed on the silicon nitride film 312.

Figure 17:
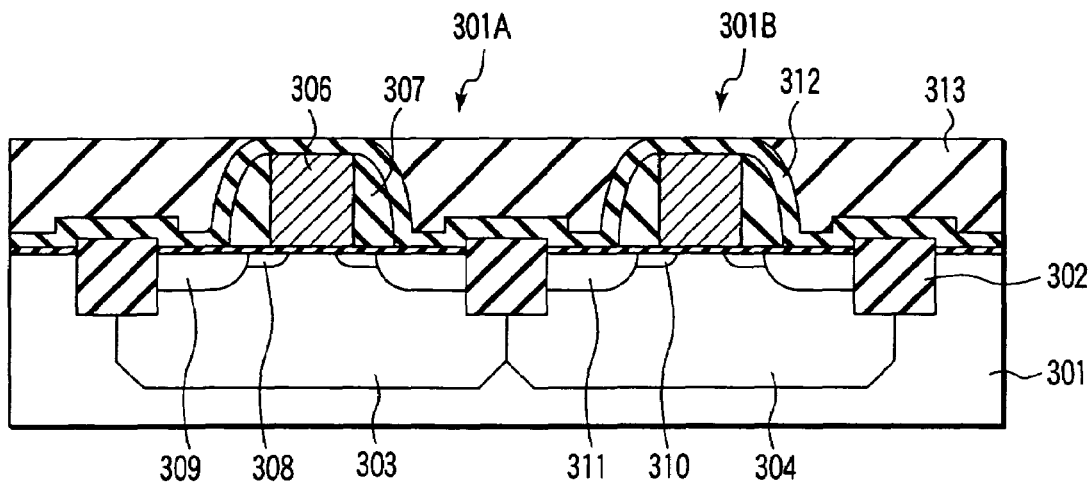
Figure 18:
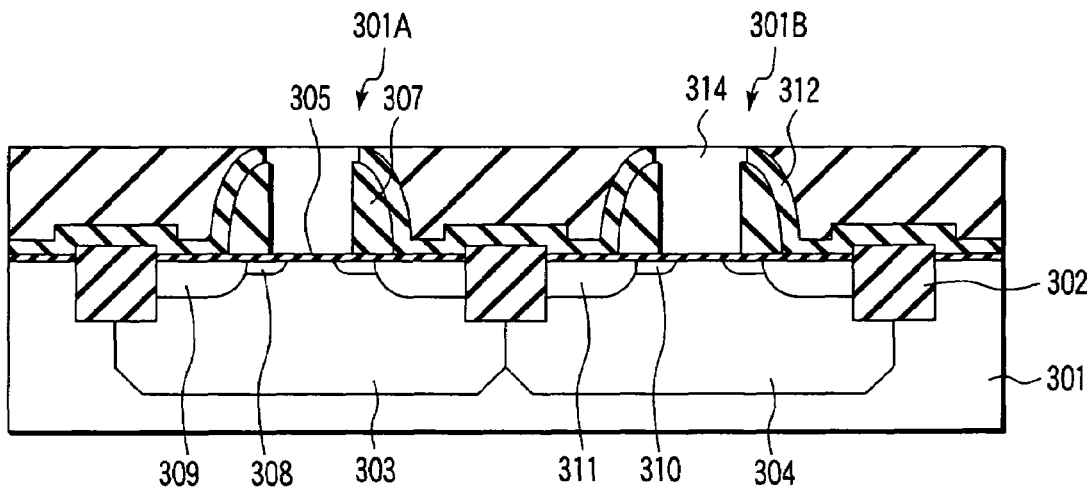
Figure 19:
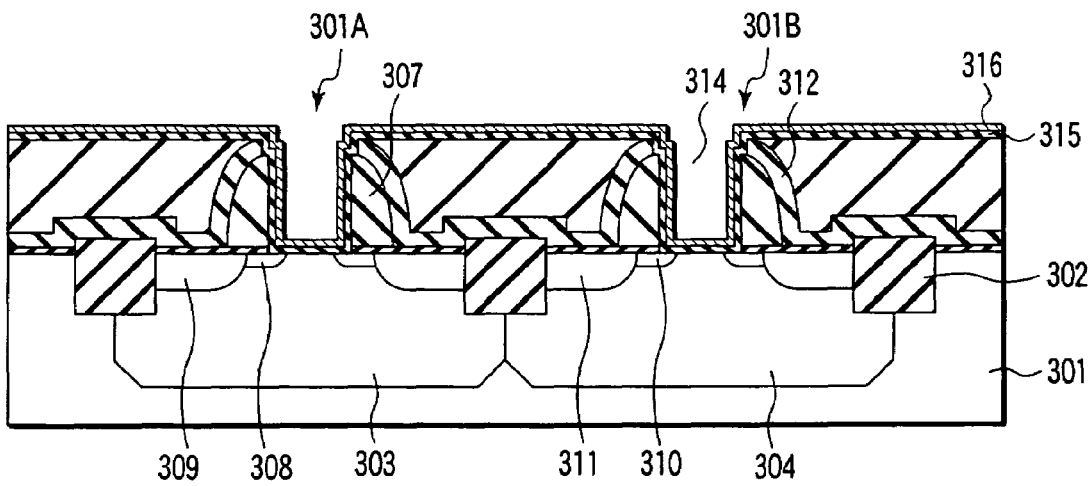

Then, as shown in FIG. 17, the inter-level insulating film 313 is polished from above by a CMP (Chemical Mechanical Polishing) method. This step is arranged to expose the upper surface of the dummy gate electrode 306 or the upper surface of the silicon nitride film 312 deposited on the dummy gate electrode 306. Then, as shown in FIG. 18, the exposed silicon nitride film 312 and the dummy gate electrodes are selectively removed to form recess portions 314. Then, as shown in FIG. 19, the portions of the dummy gate dielectric film 305 exposed at the bottom of the recess portions 314 are removed.

Then, a gate dielectric (insulating) film 315 is deposed all over the substrate to cover the inner surface of the recess portions 314. The gate dielectric film 315 may be preferably made of a film of $HfO_2$, $HfSi_xO_y$, $HfAl_xO_y$, or $SiO_2$ doped with nitrogen. The film thickness of the gate dielectric film 315 is preferably set to agree with an effective film thickness (EOT) of 1.5 nm or less, to manufacture a MISFET having a gate length of 100 nm or less. EOT is expressed by a value converted into the thickness of a silicon oxide film having an equivalent gate capacity.

Then, a TiN conductive film 316 to define the bottom portion of the gate electrode of the p-type MISFET is formed on the gate dielectric film 315 all over the substrate. The conductive film 316 is disposed to control the work function of the gate electrode of the p-type MISFET. Accordingly, the type of the material of the conductive film 316 should be determined in consideration of its work function.

Specifically, in order to decrease the threshold voltage of the p-type MISFET, the material is preferably selected to have a work function close to that of $p^+$-poly-crystalline silicon, such as a work function of 4.8 to 5.3 eV. For example, in the case of a pure metal, a Group-VIII element, such as Ni, Pd, Pt, Co, Rh, or Ru, is preferably used. Alternatively, a metal silicide, a metal nitride, or another compound may be used, as long as it has a metallic band structure with a work function close to that of $p^+$-poly-crystalline silicon. The film thickness of the conductive film 316 is preferably set to be about 5 nm, but it may be set at a very small value of about 1 to 2 nm. In this embodiment, a titanium nitride (TiN) film having a work function of about 4.8 eV is used as the conductive film 316.

Figure 20:
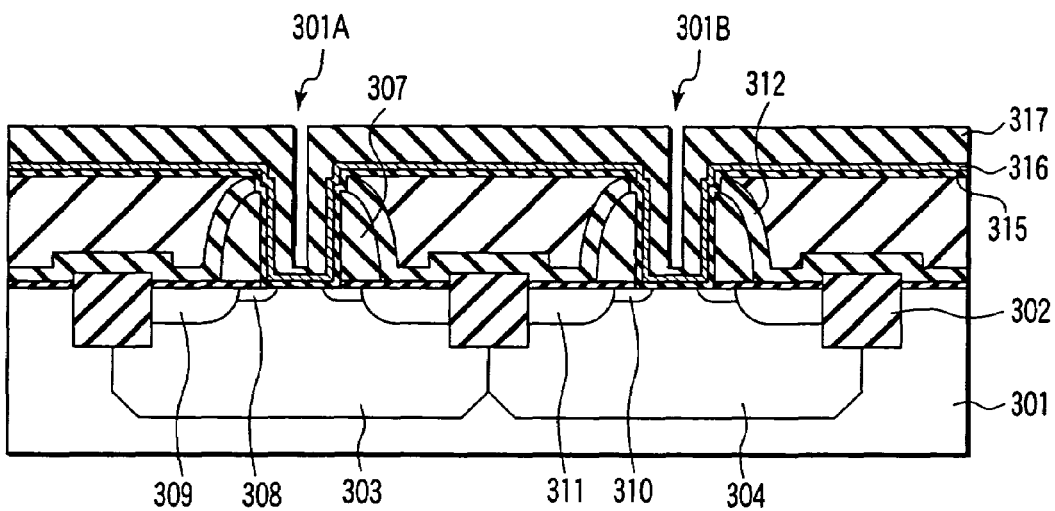

Then, as shown in FIG. 20, a silicon-containing dielectric (insulating) film is deposited on the conductive film 316 all over the substrate. Further, the surface of the silicon-containing dielectric film is doped with nitrogen to form a reinforced silicon-containing dielectric film 317. The silicon-containing dielectric film used here may be a film selected from the group consisting of a silicon nitride film, a silicon oxynitride film, and a silicon oxide film. Such a film may be formed by CVD using a first process gas containing a silane family gas, and a second process gas containing a gas selected from the group consisting of a nitriding gas, an oxynitriding gas, and an oxidizing gas, as described in the first embodiment.

The reinforced silicon-containing dielectric film 317 is obtained by doping the surface of the silicon-containing dielectric film with nitrogen to nitride only the surface. The step of doping with nitrogen may be performed by a plasma nitriding process, nitrogen ion implantation, or heating process in a nitrogen-containing atmosphere, such as ammonia, as described in the first embodiment. Of them, the plasma nitriding process is preferably used. The plasma nitriding process makes it possible to introduce nitrogen into a very thin surface region at a high concentration with high controllability. In this case, the film can easily be given a desired wet-etching resistance, and further the film can be easily removed thereafter, as needed, since the portion doped with nitrogen is very thin.

Figure 21:
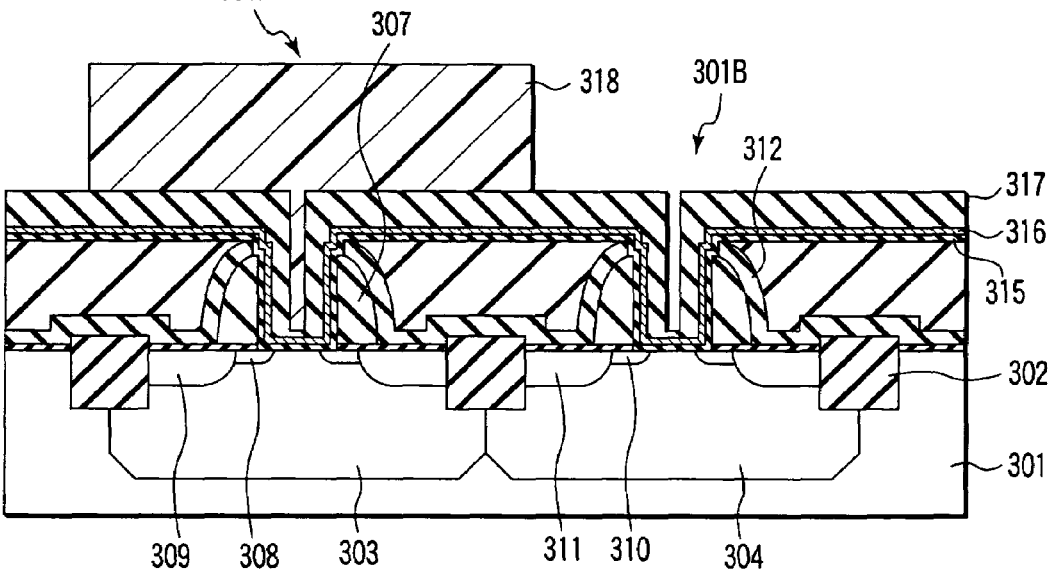
Figure 22:
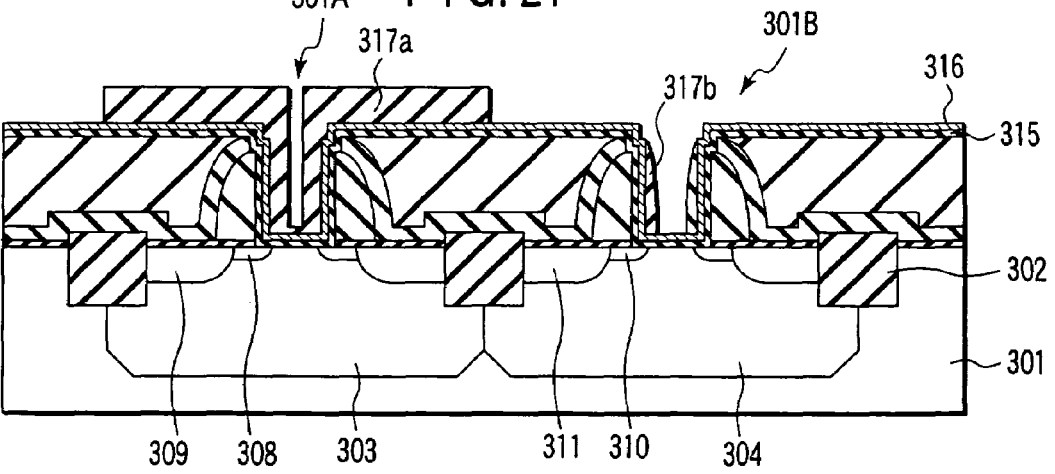

Then, as shown in FIG. 21, a photo-resist mask 318 is formed by a photolithography method, so that it covers at least an area where the gate electrode of the p-type MISFET is to be formed. Then, as shown in FIG. 22, the reinforced silicon-containing dielectric film 317 is etched by anisotropic etching, such as RIE, using the photo-resist mask 318. With this step, an etching mask 317a is formed to cover at least the area where the gate electrode of the p-type MISFET is to be formed. Then, the photo-resist mask 318 is removed. It should be noted that, after the reinforced silicon-containing dielectric film 317 is etched, residues 317b of the silicon-containing dielectric film 317 remain on the side surface in the recess portion 314 within the second area 301B and so forth.

Figure 23:
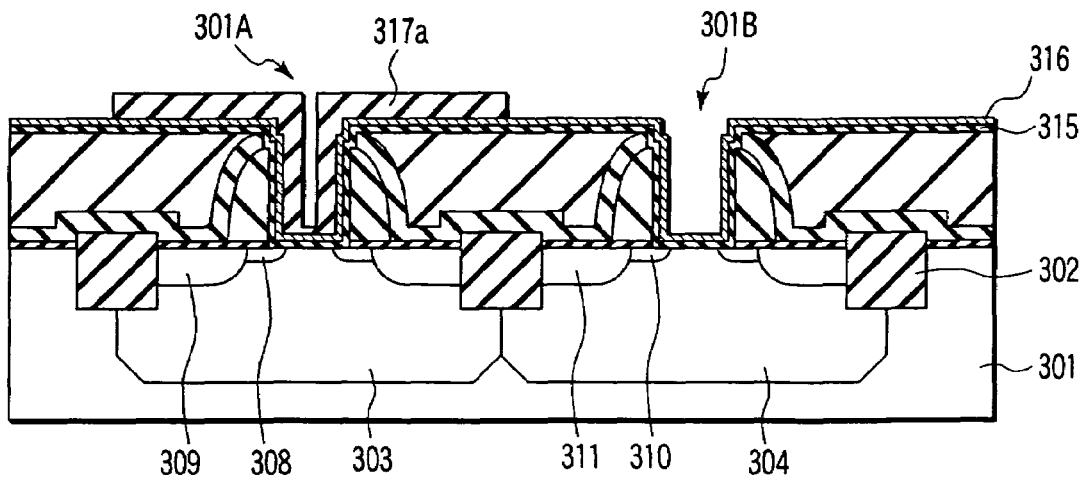

Then, as shown in FIG. 23, the residues 317b of the silicon-containing dielectric film 317 are removed by wet etching using a solution containing HF (hydrogen fluoride). In this respect, the residues 317b do not correspond to the exposed surface layer of the reinforced silicon-containing dielectric film 317, but to the portion thereof undoped with nitrogen. Accordingly, the residues 317b render a higher wet-etching rate, while the surface layer of the etching mask 317a renders a lower etching rate, thanks to the nitriding process. Thus, the residues 317b can be removed while the etching mask 317a is less etched.

Figure 24:
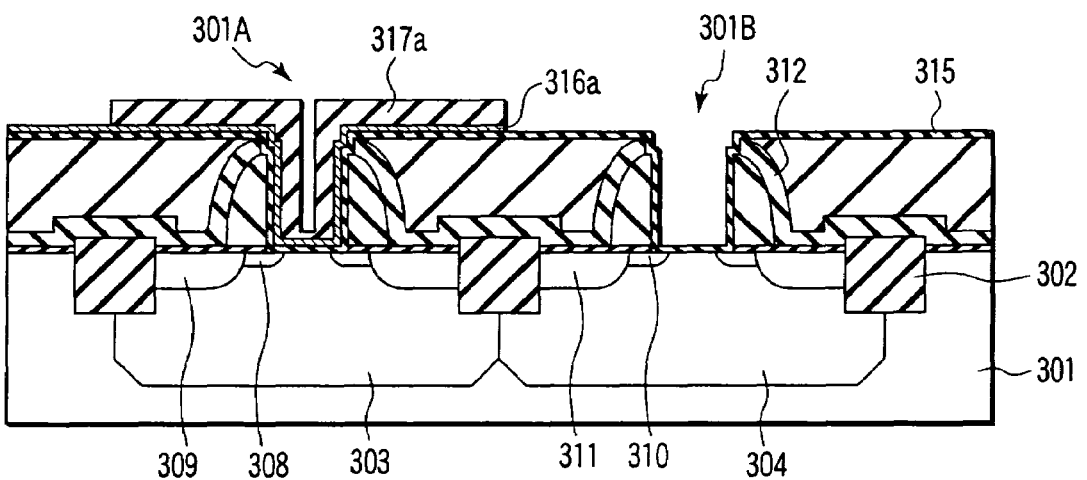

Then, as shown in FIG. 24, wet etching using a solution of, e.g., $H_2O_2$ or a mixture of $H_2SO_4$ and $H_2O_2$ is performed thorough the etching mask 317a used as a mask. Consequently, a pre-patterned conductive film 316a is formed by patterning of the conductive film 316. The pre-patterned conductive film 316a is shaped to cover at least that part of the gate dielectric film 315 where the gate electrode of the p-type MISFET is to be formed in the first area 301A. On the other hand, this patterning exposes that part of the gate dielectric film 315 where the gate electrode of the n-type MISFET is to be formed in the second area 301B.

Figure 25:
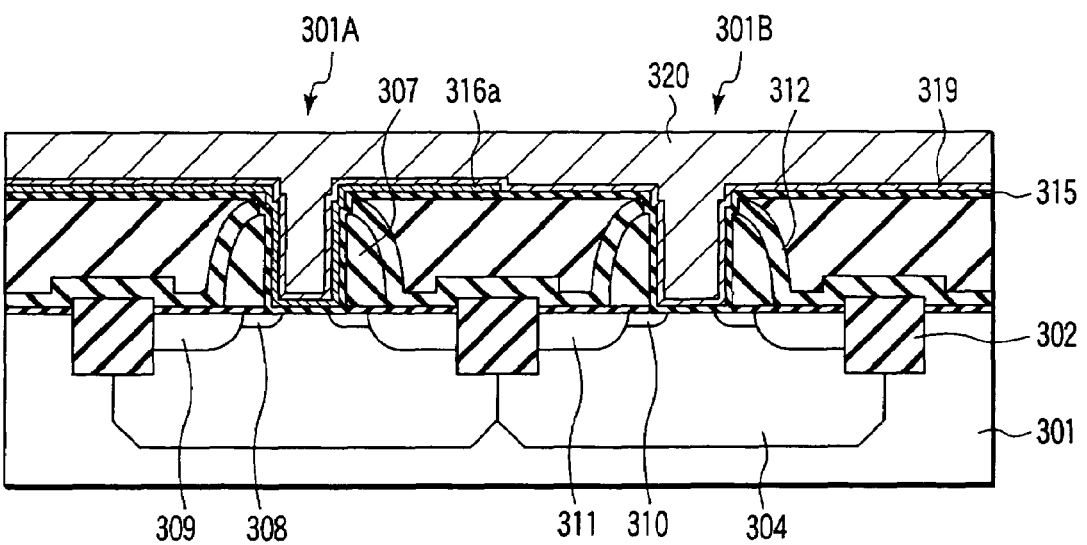

Then, as shown in FIG. 25, the etching mask 317a is removed, using a solution containing HF and so forth. At this time, the nitrided surface layer of the etching mask has already been removed by etching for removing the residues 317b described above, and thus the remaining portion renders a higher etching rate. This makes it possible to shorten the time during which the gate dielectric film 315 is exposed to the wet etching.

Then, a conductive film 319 to define the bottom portion of the gate electrode of the n-type MISFET is formed all over the substrate. The conductive film 319 is disposed to control the work function of the gate electrode of the n-type MISFET. Accordingly, the type of the material of the conductive film 319 should also be determined in consideration of its work function.

Specifically, in order to decrease the threshold voltage of the n-type MISFET, the material is preferably selected to have a work function close to that of $n^+$-poly-crystalline silicon, such as a work function of 3.9 to 4.2 eV. For example, in the case of a pure metal, a Group-IVa element, such as Ti, Zr, or Hf, a Group-Va element, such as V, Nb, or Ta, or a Group-VIa element, such as Cr, Mo, or W, is preferably used. Alternatively, a metal silicide, a metal nitride, or another compound may be used, as long as it has a metallic band structure with a work function close to that of $n^+$-poly-crystalline silicon. The film thickness of the conductive film 319 may be set at a very small value of about 1 to 2 nm.

Then, a conductive film 320 to decrease the resistance of the gate electrode is deposited all over the substrate. The film thickness of the conductive film 320 is preferably set to provide a sheet resistance of about 5Ω/□ or less, such as about 40 to 50 nm in the case of W being used. In this embodiment, the conductive film 319 and conductive film 320 are made of different conductive materials. However, where the material selected for the conductive film 319 has a resistivity almost equal to or less than that required for the conductive film 320 and suitable for the subsequent steps, the conductive film 319 and conductive film 320 are made of one integral film. The conductive film 316 for the gate electrode of the p-type MISFET and the conductive film 319 for the gate electrode of the n-type MISFET may be deposited in an order reverse to that of the embodiment, in consideration of their workability, reactivity, and so forth.

Figure 26:
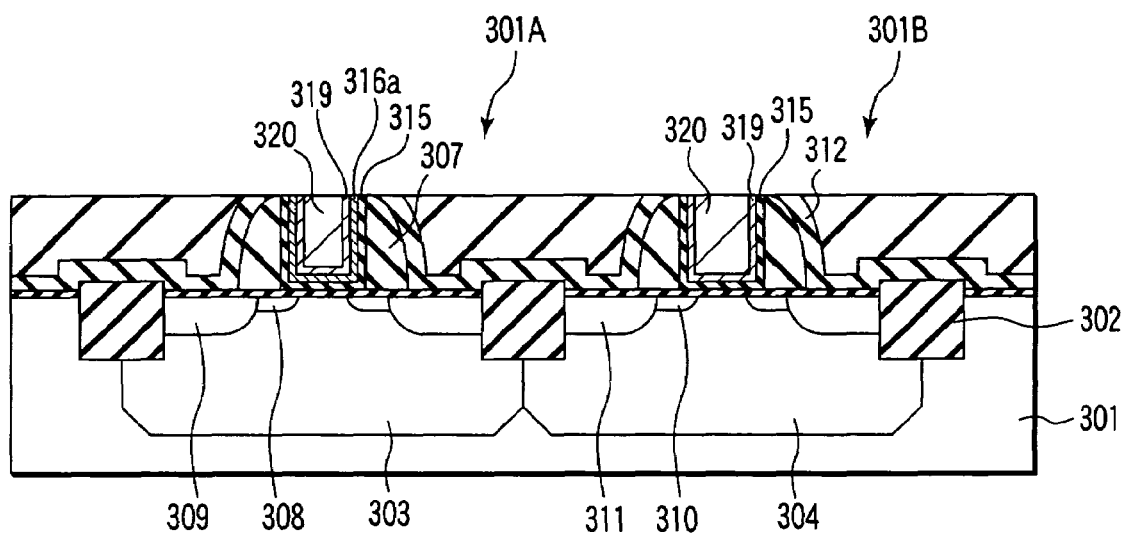
Figure 27:
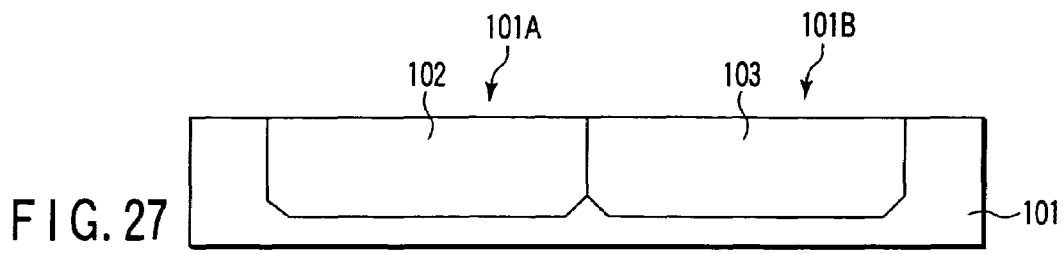
FIGS. 27, 28, 29, 30, and 31 are sectional views showing sequentially ordered steps in a method for manufacturing a semiconductor device disclosed in Non-Patent Document 1.
Figure 28:
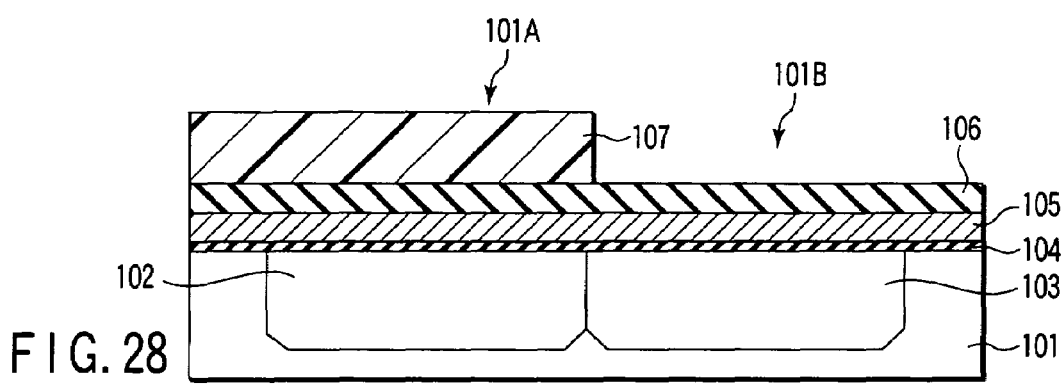

Then, as shown in FIG. 26, a CMP method or the like is used to remove those portions of the insulating film 315 and conductive films 316, 319, and 320 which are deposited outside the recess portions 314. Thereafter, inter-level insulating films, interconnections, and so forth are formed by conventional techniques to complete the MISFETs.

In the method according to the second embodiment described above, the etching mask 317a used for etching the conductive film 316 is formed from the reinforced silicon-containing dielectric film 317 having a surface doped with nitrogen, as in the first embodiment. Accordingly, when wet etching using an HF-containing solution is performed to remove the residues 317b generated by etching for forming the etching mask 317a, the etching rate of the etching mask 317a can be set low. Consequently, the portion covered with the etching mask 317a is prevented from being damaged, and there is no need to use excessive etching that may penetrate the conductive film 316 and damage the gate dielectric film 315. Particularly, where a recess portion having a large aspect ratio is present on a substrate as in this embodiment, an etching mask having a surface doped with nitrogen is effectively used to remove residues.

The present invention is not limited to the embodiments described above, and it may be modified in various manners. For example, in the embodiments described above, the semiconductor device manufactured is exemplified by MISFETs, but the semiconductor device is not limited to this type. Further, the technique of utilizing the reinforced silicon-containing dielectric film having a surface doped with nitrogen can be widely applied to various processes which include a step of performing wet etching to remove etching residues generated when an etching mask is formed from a silicon-containing dielectric film. Furthermore, this technique may be applied to formation of a silicon-containing insulating having a surface with a low etching rate, which is usable as, e.g., a sidewall or offset spacer, other than an etching mask.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, the method comprising:
   forming an etching target film on an underlayer on a target substrate;
   forming a silicon-containing dielectric film, one selected from the group consisting of a silicon nitride film, a silicon oxynitride film, and a silicon oxide film, on the etching target film;
   doping a surface of the silicon-containing dielectric film with nitrogen to change an etching rate of the silicon-containing dielectric film relative to a predetermined solution such that the etching rate is lower at a surface layer thereof doped with nitrogen than at a base layer thereof below the surface layer, by use of a dose of nitrogen to obtain a nitrogen concentration of 10 to 60 atm% in the surface of the silicon-containing dielectric film;
   patterning the surface layer and the base layer of the silicon-containing dielectric film by a first etching process comprising anisotropic etching using a resist mask disposed on the silicon-containing dielectric film, thereby forming an etching mask;
   subsequent to the first etching process and removing of the resist mask, performing a second etching process comprising wet etching using the predetermined solution on a resultant structure on the target substrate, thereby removing etching residues derived from the base layer of the silicon-containing dielectric film;
   subsequent to the second etching process, patterning the etching target film by a third etching process using the etching mask; and
   subsequent to the third etching process, removing the etching mask.

2. The method according to claim 1, wherein said doping a surface of the silicon-containing dielectric film with nitrogen is performed by plasma nitriding.

3. The method according to claim 2, wherein the plasma nitriding comprises supplying microwaves through a planar antenna into a process chamber to turn a nitrogen-containing gas into plasma.

4. The method according to claim 3, wherein the predetermined solution contains hydrogen fluoride.

5. The method according to claim 1, wherein said doping a surface of the silicon-containing dielectric film with nitrogen is performed by ion implantation.

6. The method according to claim 1, wherein said doping a surface of the silicon-containing dielectric film with nitrogen is performed by a heating process in a nitrogen-containing atmosphere.

7. The method according to claim 1, wherein the silicon-containing dielectric film is formed by CVD using a first process gas containing at least one gas selected from the group consisting of dichlorosilane, hexachlorodisilane, monosilane, disilane, hexamethyldisilazane, tetrachiorosilane, disilylamine, trisilylamine, and bistertialbutylaminosilane, and a second process gas containing at least one gas selected from the group consisting of ammonia, nitrogen, dinitrogen oxide, nitrogen oxide, oxygen, and ozone.

8. The method according to claim 1, wherein the anisotropic etching is reactive ion etching (RIE).

9. The method according to claim 1, wherein the third etching process is wet etching.

10. The method according to claim 1, wherein the etching target film consists essentially of a material having a metallic band structure.

11. The method according to claim 1, wherein the underlayer comprises a gate dielectric film, and the etching target film is used to form a part of a gate electrode.

12. A method for manufacturing a semiconductor device, the method comprising:

forming an etching target film on an underlay on a target substrate;

forming a silicon oxide film on the etching target film;

doping a surface of the silicon oxide film with nitrogen by plasma nitriding to change an etching rate of the silicon oxide film relative to a predetermined solution containing hydrogen fluoride such that the etching rate is lower at a surface layer thereof doped with nitrogen than at a base layer thereof below the surface layer, by use of a dose of nitrogen to obtain a nitrogen concentration of 10 to 60 atm% in the surface of the silicon oxide film;

patterning the surface layer and the base layer of the silicon oxide film by a first etching process comprising anisotropic etching using a resist mask disposed on the silicon oxide film, thereby forming an etching mask;

subsequent to the first etching process and removing of the resist mark, performing a second etching process comprising wet etching using the predetermined solution on a resultant structure on the target substrate, thereby removing etching residues derived from the base layer of the silicon oxide film;

subsequent to the second etching process, patterning the etching target film by a third etching process using the etching mask; and subsequent to the third etching process, removing the etching mask.

13. The method according to claim 12, wherein the plasma nitriding comprises supplying microwaves through a planar antenna into a process chamber to turn a nitrogen-containing gas into plasma.

14. The method according to claim 12, wherein the anisotropic etching is reactive ion etching (RIE).

15. The method according to claim 12, wherein the third etching process is wet etching.

16. The method according to claim 12, wherein the etching target film consists essentially of a material having a metallic band structure.

* * * * *